United States Patent
Chen et al.

(10) Patent No.: US 12,402,480 B2
(45) Date of Patent: *Aug. 26, 2025

(54) SUBSTRATE MODULE WITH TRANSISTOR

(71) Applicant: InnoLux Corporation, Miao-Li County (TW)

(72) Inventors: Tsang-Lung Chen, Miao-Li County (TW); Jhe-Ciou Jhu, Miao-Li County (TW); Jian-Yu Wang, Miao-Li County (TW); Chia-Hao Hsieh, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/415,606

(22) Filed: Jan. 17, 2024

(65) Prior Publication Data
US 2024/0206230 A1   Jun. 20, 2024

Related U.S. Application Data

(63) Continuation of application No. 17/874,242, filed on Jul. 26, 2022, now Pat. No. 11,910,649, which is a continuation of application No. 16/813,753, filed on Mar. 10, 2020, now Pat. No. 11,430,846.

(30) Foreign Application Priority Data

Mar. 19, 2019   (CN) .......................... 201910209949.5

(51) Int. Cl.
*H10K 59/121*   (2023.01)
*H01L 29/786*   (2006.01)
*H10D 30/67*   (2025.01)
*H10K 59/123*   (2023.01)

(52) U.S. Cl.
CPC ..... *H10K 59/1213* (2023.02); *H10D 30/6755* (2025.01); *H10D 30/6757* (2025.01); *H10K 59/123* (2023.02)

(58) Field of Classification Search
CPC ....................... H01L 29/7869; H01L 29/78696
See application file for complete search history.

(56) References Cited

U.S. PATENT DOCUMENTS

| 11,430,846 | B2 * | 8/2022 | Chen | H10K 59/1213 |
| 11,910,649 | B2 * | 2/2024 | Chen | H10D 30/6757 |
| 2013/0193431 | A1 * | 8/2013 | Yamazaki | H10D 62/80 |
| | | | | 438/151 |
| 2018/0151595 | A1 * | 5/2018 | Saitoh | H10D 86/481 |
| 2020/0203534 | A1 * | 6/2020 | Park | H10D 30/6755 |

* cited by examiner

Primary Examiner — Victoria K. Hall
(74) Attorney, Agent, or Firm — Winston Hsu

(57) ABSTRACT

A substrate module includes a first substrate and a transistor unit. The transistor unit is disposed on the first substrate, and the transistor unit includes an active layer, a first electrode, and a second electrode. The active layer has a first surface and a second surface, and the first surface is opposite to the second surface. The first electrode and the second electrode at least partially overlap the active layer. The second surface contacts the first electrode and the second electrode. The active layer has a first range and a second range, and the first range is closer to the second surface than the second range. A first gallium concentration and a first zinc concentration exist within the first range in the active layer, and the first zinc concentration is higher than the first gallium concentration.

13 Claims, 10 Drawing Sheets

SUBSTRATE MODULE WITH TRANSISTOR

CROSS REFERENCE TO RELATED APPLICATIONS

This application is a continuation application of U.S. application Ser. No. 17/874,242, filed on Jul. 26, 2022, now U.S. Pat. No. 11,910,649, issued Feb. 20, 2024, which is a continuation application of U.S. application Ser. No. 16/813,753, filed on Mar. 10, 2020, now U.S. Pat. No. 11,430,846, issued Aug. 30, 2022. The contents of these applications are incorporated herein by reference.

BACKGROUND OF THE DISCLOSURE

1. Field of the Disclosure

The present disclosure relates to a substrate module, and more particularly, to a substrate module including a transistor unit.

2. Description of the Prior Art

The applications of flat panel displays have developed rapidly, and various daily necessities such as televisions, mobile phones, and automobiles have been combined with flat panel displays. A thin film transistor (TFT) is a semiconductor unit widely used in flat panel display technology, such as a liquid crystal display (LCD), an organic light emitting diode (OLED) display, a light emitting diode display, and an electronic paper (E-paper) display. Thin film transistors can be used to switch voltage or current for controlling display effects. The thin film transistors used in the display industry may be distinguished according to the semiconductor layer material used therein, including amorphous silicon TFTs (a-Si TFTs), poly silicon TFTs, and oxide semiconductor TFTs, etc. Oxide semiconductor thin film transistors have the advantages of high electron mobility, low leakage current, and simple process, and are considered as one of the mainstream thin film transistor technologies in the future.

SUMMARY OF THE DISCLOSURE

It is one of the objectives of the present disclosure to provide a substrate module. Different concentrations exist at different thickness locations within an active layer of a transistor unit for improving the performance of the active layer and the transistor unit.

A substrate module is provided in an embodiment of the present disclosure. The substrate module includes a first substrate and a transistor unit. The transistor unit is disposed on the first substrate, and the transistor unit includes an active layer, a first electrode, and a second electrode. The active layer has a first surface and a second surface, and the first surface is opposite to the second surface. The first electrode and the second electrode at least partially overlap the active layer. The second surface contacts the first electrode and the second electrode. The active layer has a first range and a second range, and the first range is closer to the second surface than the second range. A first gallium concentration and a first zinc concentration exist within the first range in the active layer, and the first zinc concentration is higher than the first gallium concentration.

A substrate module is provided in an embodiment of the present disclosure. The substrate module includes a first substrate and a transistor unit. The transistor unit is disposed on the first substrate, and the transistor unit includes an active layer, a first electrode, and a second electrode. The active layer has a first surface and a second surface, and the first surface is opposite to the second surface. The first electrode and the second electrode at least partially overlap the active layer. The second surface contacts the first electrode and the second electrode. The active layer has a first range and a second range, and the first range is closer to the second surface than the second range. A first zinc concentration and a first indium concentration exist within the first range in the active layer, and the first zinc concentration is higher than the first indium concentration.

These and other objectives of the present disclosure will no doubt become obvious to those of ordinary skill in the art after reading the following detailed description of the embodiment that is illustrated in the various figures and drawings.

DETAILED DESCRIPTION

Certain terms are used throughout the description and following claims to refer to particular components. As one skilled in the art will understand, equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods. The use of these ordinal numbers is only used to make a claimed element with a certain name clear from another claimed element with the same name.

It should be understood that embodiments are described below to illustrate different technical features, but these technical features may be mixed to be used or combined with one another in different ways without conflicting with one another.

Figure 1:
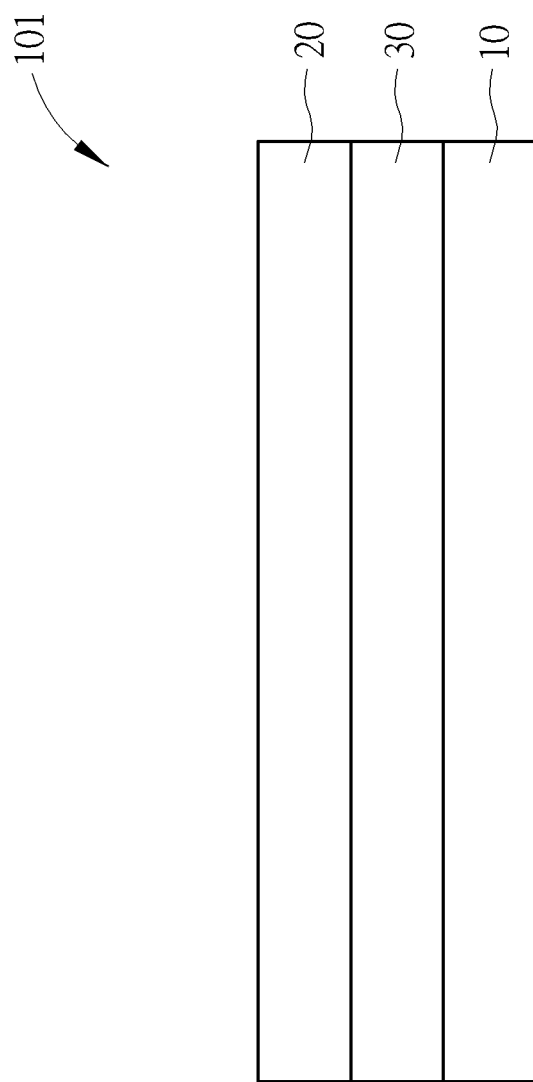
FIG. 1 is a schematic diagram of a work module according to a first embodiment of the present disclosure.
Figure 2:
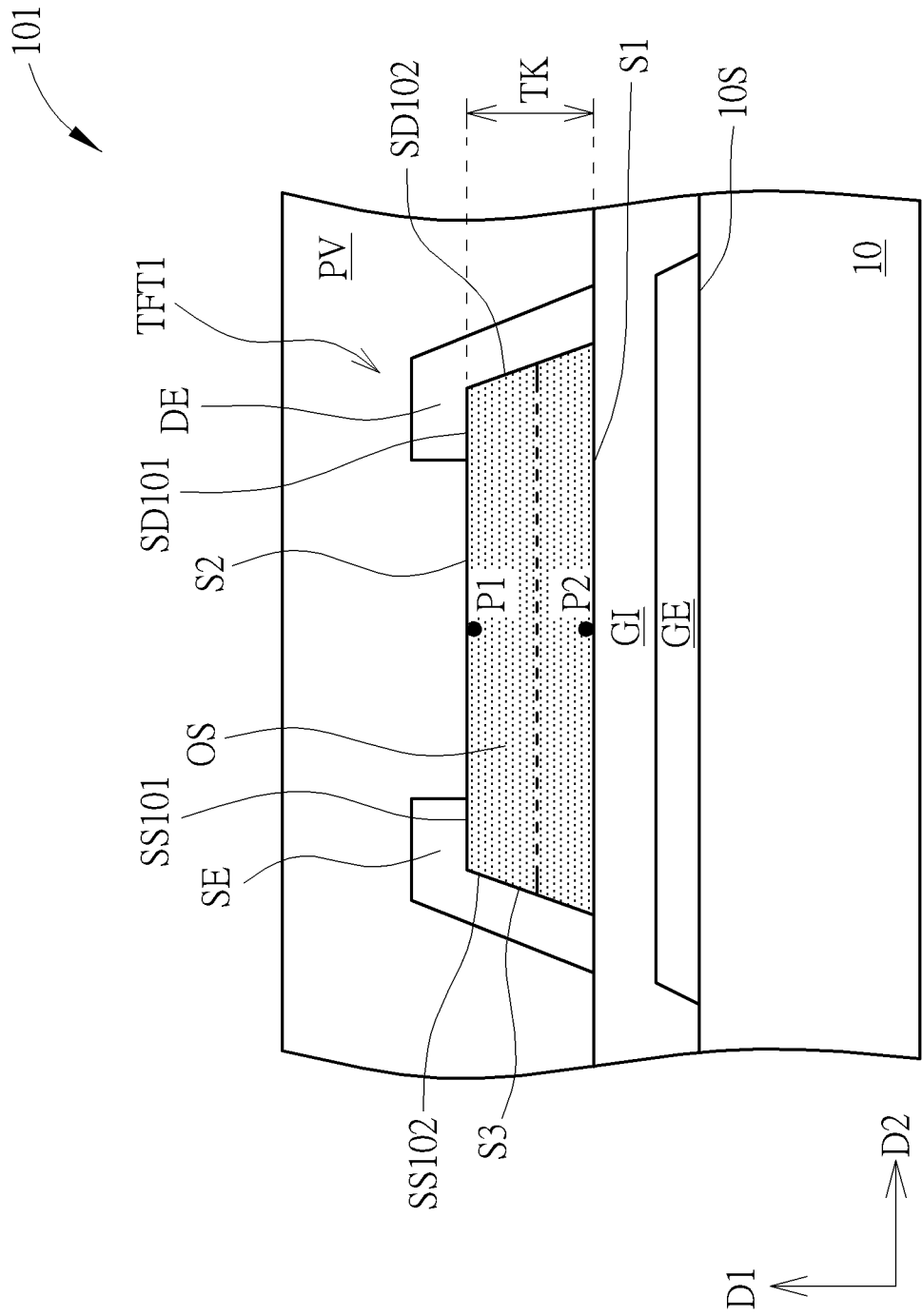
FIG. 2 is a schematic diagram of a partial enlargement of the work module according to the first embodiment of the present disclosure.

Please refer to FIG. 1 and FIG. 2. FIG. 1 is a schematic diagram of a work module according to a first embodiment of the present disclosure, and FIG. 2 is a schematic diagram of a partial enlargement of the work module in this embodiment. As shown in FIG. 1 and FIG. 2, a work module 101 is provided in this embodiment. The work module 101 includes a first substrate 10 and a transistor unit TFT1. The transistor unit TFT1 is disposed on the first substrate 10, and the transistor unit TFT1 includes an active layer OS. The active layer OS has a first surface S1, a second surface S2, and a lateral surface S3. The first surface S1 and the second surface S2 may be two opposite surfaces of the active layer OS respectively. The first surface S1 and the second surface S2 may be elongated in the same direction (such as a second direction D2), and the lateral surface S3 may be used to connect the first surface S1 and the second surface S2. In this embodiment, the active layer OS may be substantially a trapezoid structure having a wider upper part and a narrower lower part. In addition, a thickness TK exists from the first surface S1 to the second surface S2, and the direction of the thickness TK may be parallel to a first direction D1. In some embodiments, the first direction D1 may be perpendicular to a surface 10S of the first substrate 10, and the second direction D2 may be parallel to the surface 10S of the first substrate 10, but not limited thereto.

Specifically, in some embodiments, the work module 101 may further include a second substrate 20 and a medium 30. The first substrate 10 may include a glass substrate, a plastic substrate, a ceramic substrate, polyimide (PI), polyethylene terephthalate (PET), or a substrate made of other suitable materials. The second substrate 20 may be a polarizer, a protection layer (such as a protection layer made of a water and oxygen blocking layer and/or a stacked organic and inorganic layer), or a protection plate. In some embodiments, the work module 101 may be an antenna module, a spliced device, or other types of display modules, such as an organic light emitting diode (OLED) module, an inorganic light emitting diode module (such as mini-LED module, micro-LED module, and quantum dot light emitting diode (QD-LED) module), or other suitable types of modules, and the medium 30 may include different materials and/or structures correspondingly. For example, when the work module 101 is a display module, the first substrate 10 may be a thin film transistor array (TFT array) substrate, the second substrate 20 may include color filter substrate selectively, and the medium 30 may selectively include liquid crystal (LC), a quantum dot (QD), a fluorescence molecule, a phosphor molecule, an organic light emitting diode, an inorganic light emitting diode, or other medium, but not limited thereto. A color filter may be selectively disposed on the first substrate 10 according to design requirements. The work module 101 in some embodiments of the present disclosure may be a flexible device, a touch device, a curved device, or a free shape device, but the present disclosure is not limited to this.

When the work module 101 is an antenna work module, the medium 30 may be a medium configured to adjust and/or transmit antenna waves.

As shown in FIG. 2, in some embodiments, the transistor unit TFT1 disposed on the first substrate 10 may further include a gate electrode GE, a gate dielectric layer G1, a source electrode SE, and a drain electrode DE, and the work module 101 may further include a protection layer PV at least partially covering the transistor unit TFT1. The gate dielectric layer G1 is at least partially disposed between the active layer OS and the gate electrode GE, and the source electrode SE and the drain electrode DE at least partially overlap the active layer OS respectively. The source electrode SE contacts the active layer OS and has a source electrode contact surface SS101 and a source electrode contact surface SS102. The drain electrode DE contacts the active layer OS and has a drain electrode contact surface SD101 and a drain electrode contact surface SD102. In some embodiments, the source electrode contact surface SS101 and the source electrode contact surface SS102 may be flat surfaces or non-flat surfaces, and the drain electrode contact surface SD101 and the drain electrode contact surface SD102 may be flat surfaces or non-flat surfaces, but not limited thereto. In this embodiments, the active layer OS has a first surface S1 and a second surface S2. A part of the second surface S2 contacts the source electrode contact surface SS101, and another part of the second surface S2 contacts the drain electrode contact surface SD101. In an embodiment, at least a part of the first surface S1 may be defined as an interface between the active layer OS and the gate dielectric layer G1. In some embodiments, the first surface S1 of the active layer OS extends in the second direction D2 substantially in a cross-sectional diagram, the second surface S2 of the active layer OS extends in the second direction D2 substantially in the cross-sectional diagram, and the first surface S1 may be substantially parallel with the second surface S2. In some embodiments, the first surface S1 and the second surface S2 may be flat surfaces or non-flat surfaces, and the first surface S1 may be regarded as being parallel with the second surface S2 as long as the first surface S1 and the second surface S2 extend substantially in the second direction D2. The gate electrode GE, the source electrode SE, and the drain electrode DE may respectively include a single layer or a multiple layer structure composed of a conductive material, such as metal, metal oxide, or other suitable conductive materials. For example, the gate electrode GE, the source electrode SE, and the drain electrode DE may respectively include at least one of aluminum, copper, silver, chromium, titanium, or molybdenum, a composed layer of the above-mentioned materials, or an alloy of the above-mentioned materials, but not limited thereto. The material of the gate dielectric layer G1 and the material of the protection layer PV may respectively include inorganic materials and organic materials. For example, inorganic materials include silicon nitride, silicon oxide, silicon oxynitride, aluminum oxide ($Al_2O_3$), and hafnium oxide ($HfO_2$); and organic materials include acrylic resin, or other suitable dielectric materials. In some embodiments, the active layer OS may include an oxide semiconductor material including zinc, such as indium gallium zinc oxide (IGZO), indium tin zinc oxide (ITZO), indium gallium zinc tin oxide (IGZTO), zinc oxynitride (ZnON), zinc oxide (ZnO), zinc magnesium oxide (ZnMgO), zinc selenium oxide (ZnScO), zinc zirconium oxide (ZnZrO), titanium doped indium gallium zinc oxide (IGZO:Ti), titanium doped indium tin zinc oxide (ITZO:Ti), nitrogen doped indium gallium zinc oxide (IGZO:N), fluorine doped indium gallium zinc oxide (IGZO:F), aluminum tin zinc oxide (AITZO), hafnium indium zinc oxide (HfIZO), indium gallium tin oxide (IGTO), or other suitable oxide semiconductor materials including zinc.

Specifically, in some embodiments, the gate electrode GE may be disposed between the active layer OS and the first substrate 10, the first surface S1 of the active layer OS may be located close to the gate electrode GE, and the second surface S2 of the active layer OS may be located away from the gate electrode GE. Additionally, the source electrode SE and the drain electrode DE may be disposed at two opposite sides of the active layer OS in a horizontal direction (such as the second direction D2 shown in FIG. 2) respectively, and the source electrode SE and the drain electrode DE may be at least partially disposed on the second surface S2 of the active layer OS. Under the allocation described above, the transistor unit TFT1 may be regarded as a back channel etch (BCE) transistor, but not limited thereto. Under the abovementioned allocations of the gate electrode GE, the source electrode SE, and the drain electrode DE, a region adjacent to the first surface S1 in the active layer OS may be regarded as a back channel region, and a region adjacent to the second surface S2 in the active layer OS may be regarded as a front channel region. The performance of the active layer OS and the transistor unit TFT1 may be improved when a first zinc concentration exists within a range P1 from the second surface S2 to a site located away from the second surface S2 by a tenth of the thickness TK in the active layer OS (in the direction extending towards the first surface S1), a second zinc concentration exists within a range P2 from a site located away from the second surface S2 by nine tenths of the thickness TK in the active layer OS to the first surface S1 (in the direction extending towards the first surface S1), and the first zinc concentration is higher than the second zinc concentration. The band gap of the back channel region may be higher than the band gap of the front channel region because of the relatively higher zinc concentration in the back channel region, and the performance of the active layer OS may be improved accordingly (such as enhancing the electron mobility), but not limited thereto. For example, the electrons in the active layer OS may be limited at the middle portion of the active layer OS and most of the electrons may not be transmitted at the interfaces when the band gap of the region relatively adjacent to the back channel region in the active layer OS is relatively higher. The influence of Coulomb's scattering at the back channel and/or scattering by rough surface may be improved accordingly, and effects of enhancing the electron mobility of the transistor unit TFT1 and/or improving the reliability of the transistor unit TFT1 (such as reducing photo-leakage current and/or improving stability under bias voltage), but not limited thereto.

It is worth noting that, the composition distribution in the active layer OS described above may be obtained by controlling process condition of a film forming process of the active layer OS and/or performing a post treatment (such as an anneal treatment or a plasma treatment) after forming the active layer OS, but not limited thereto. For instance, when the active layer OS is formed by a physical vapor deposition (PVD) process, the active layer OS having different composition ratio distributions may be formed by using targets having different compositions, modifying oxygen flow rate during the process, and/or introducing other gases. In other words, a multiple layer structure may be formed according to the design requirements. For instance, a portion of the active layer OS located under a dashed line in FIG. 2 may be formed by a target in a PVD process, a portion of the active layer OS located above the dashed line may be formed by another target having different composition ratio in the PVD process, and the active layer OS shown in FIG. 2 may be a bilayer structure according to the dashed line, but not limited thereto. In some embodiments, the composition ratio distribution required in the active layer OS may be formed by using more deposition steps having different process conditions as needed. Additionally, in this embodiment, the dashed line may be located at the middle portion of the active layer OS, but not limited thereto. In some embodiments, a distance between the dashed line and the second surface S2 may range from 800 angstroms to 1000 angstroms, and a distance between the dashed line and the first surface S1 may range from 100 angstroms to 300 angstroms.

As shown in FIG. 2, in an exemplary example, the active layer OS may further include gallium. A first gallium concentration may exist within a range P1 from the second surface S2 to a site located away from the second surface S2 by a tenth of the thickness TK in the active layer OS (in the direction extending towards the first surface S1), a second gallium concentration may exist within a range P2 from a site located away from the second surface S2 by nine tenths of the thickness TK in the active layer OS to the first surface S1 (in the direction extending towards the first surface S1), and the first gallium concentration is higher than the second gallium concentration. In addition, the active layer OS may further include indium. A first indium concentration may exist within a range P1 from the second surface S2 to a site located away from the second surface S2 by a tenth of the thickness TK in the active layer OS (in the direction extending towards the first surface S1), a second indium concentration may exist within a range P2 from a site located away from the second surface S2 by nine tenths of the thickness TK in the active layer OS to the first surface S1 (in the direction extending towards the first surface S1), and the second indium concentration is higher than the first indium concentration. In other words, the zinc concentration within the range P1 relatively adjacent to the back channel may be higher than the zinc concentration within the range P2 relatively adjacent to the front channel, the gallium concentration within the range P1 may be higher than the gallium concentration within the range P2, and the indium concentration within the range P1 may be lower than the indium concentration within the range P2 for improving the performance of the active layer OS (such as enhancing the electron mobility) accordingly, but no limited thereto.

In another exemplary example, the second indium concentration described above may be reduced for not being higher than the first indium concentration obviously, and the reliability of the transistor unit TFT1 may be enhanced (such as reducing photo-leakage current and/or improving stability under bias voltage) accordingly.

Figure 3:
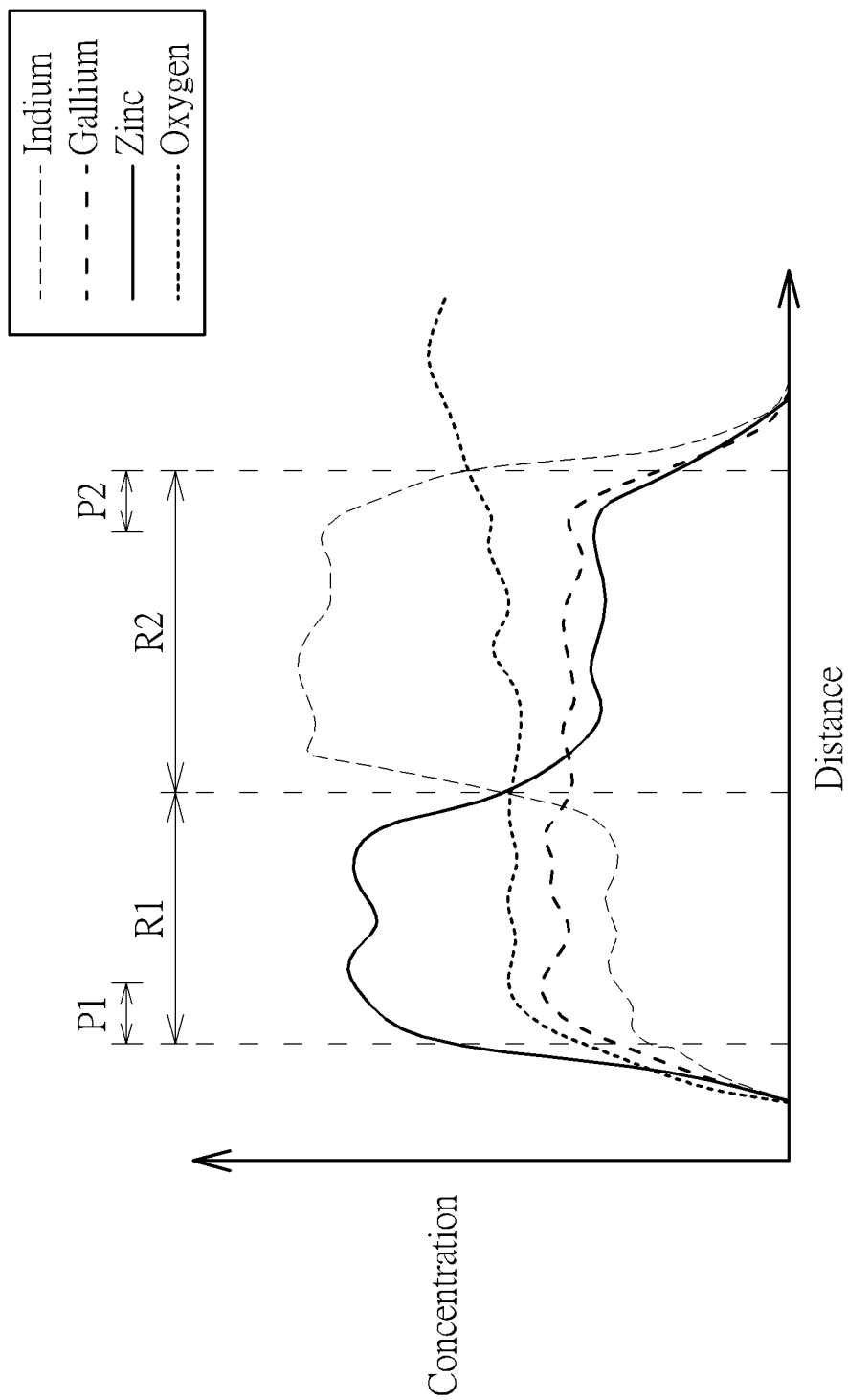
FIG. 3 is an energy dispersive spectrometer analysis result of an active layer in a work module according to an embodiment of the present disclosure.

Please refer to FIG. 2 and FIG. 3. FIG. 3 is an energy dispersive spectrometer (EDS) analysis result of the active layer OS in the work module 101 according to an embodiment of the present disclosure. A first region R1 in FIG. 3 may correspond to the portion in the active layer OS shown in FIG. 2 from the dashed line to the second surface S2, and a second region R2 in FIG. 3 may correspond to the portion in the active layer OS shown in FIG. 2 from the dashed line to the first surface S1, but not limited thereto. The horizontal axis represents a distance from the top to the bottom during analyzing the active layer OS by the energy dispersive spectrometer, and the vertical axis represents a concentration in atomic percent. As shown in FIG. 2 and FIG. 3, in some embodiments, the active layer OS may be an indium gallium zinc oxide (IGZO) layer. A first zinc concentration may exist within a range P1 from the second surface S2 to a site located away from the second surface S2 by a tenth of the thickness TK in the active layer OS (in the direction extending towards the first surface S1), a second zinc concentration may exist within a range P2 from a site located away from the second surface S2 by nine tenths of the thickness TK in the active layer OS to the first surface S1 (in the direction extending towards the first surface S1), and the first zinc concentration is higher than the second zinc concentration. Additionally, a first indium concentration may exist within a range P1 from the second surface S2 to a site located away from the second surface S2 by a tenth of the thickness TK in the active layer OS (in the direction extending towards the first surface S1), a second indium concentration may exist within a range P2 from a site located away from the second surface S2 by nine tenths of the thickness TK in the active layer OS to the first surface S1 (in the direction extending towards the first surface S1), and the second indium concentration is higher than the first indium concentration.

According to the condition shown by FIG. 2 and FIG. 3, the compositions at different locations will still be slightly different from one another even the oxide semiconductor layer is formed by the same target. Therefore, the concentration comparison in the active layer OS described in this disclosure is calculated by taking an average of at least any three points in the measurement within a thickness range (such as within the range P1 from the second surface S2 to a site located away from the second surface S2 by a tenth of the thickness TK). In addition, when comparing the material composition at different thickness locations, the measurements at different locations (such as each point in the range P1 and the range P2) must be measured by the same measuring apparatus and under the same measurement environment (such as the identical sample in the same chamber) successively.

Figure 4:
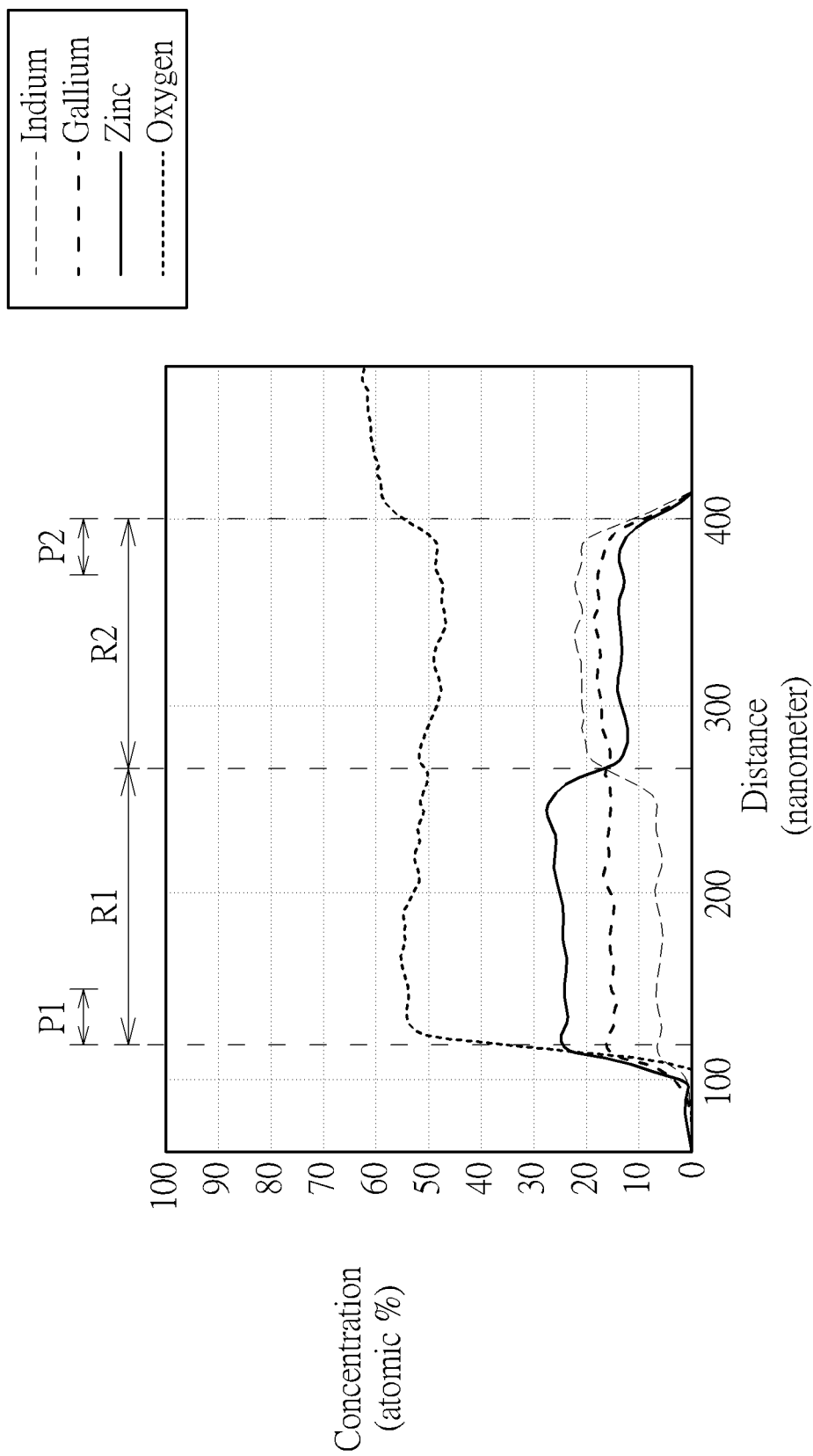
FIG. 4 is an energy dispersive spectrometer analysis result of an active layer in a work module according to another embodiment of the present disclosure.

Please refer to FIG. 2 and FIG. 4. FIG. 4 is an EDS analysis result of the active layer OS in the work module 101 according to another embodiment of the present disclosure. As shown in FIG. 2 and FIG. 4, in some embodiments, the second indium concentration described above may be higher than the first indium concentration, the first zinc concentration may be higher than the second indium concentration, and the band gap of the active layer OS adjacent to the back channel (such as being adjacent to the second surface S2) may be still higher than the band gap of the active layer OS adjacent to the front channel (such as being adjacent to the first surface S1), but not limited thereto.

Figure 5:
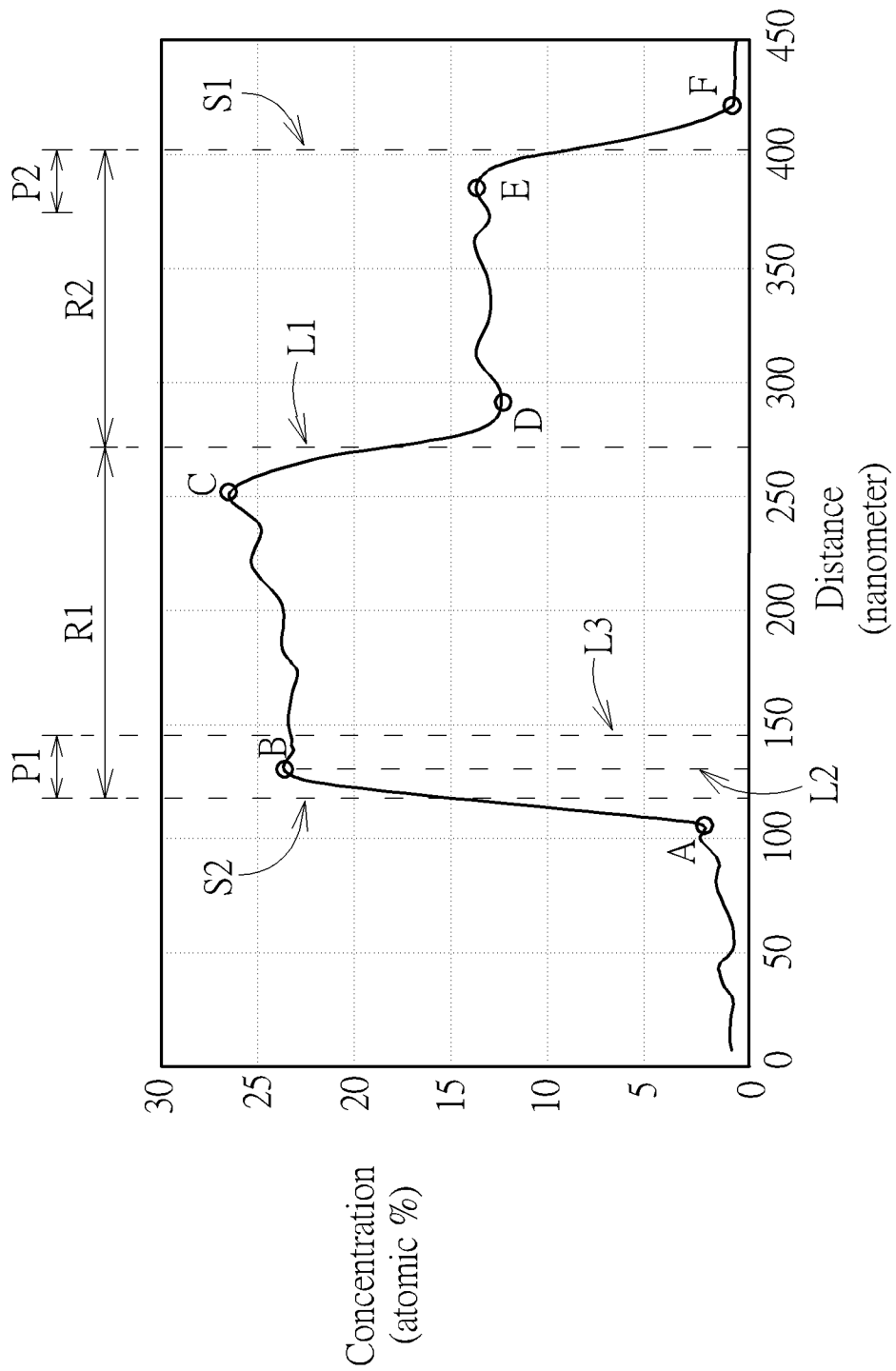
FIG. 5 is an energy dispersive spectrometer analysis result of zinc element concentration proportions in FIG. 4.

FIG. 5 is an EDS analysis result of zinc element concentration proportions in FIG. 4. The highest points B, C, and E and the lowest points A, D, and F relatively corresponding to the locations where the zinc concentration changes intensely may be obtained in FIG. 5. A half height position from the lowest point to the highest point may be taken as a center line. For instance, a half height position from the lowest point A to the highest point B may correspond to the second surface S2, a half height position from the lower point D to the highest point C may correspond to a dashed line L1, and the range between the second surface S2 and the dashed line is the first region R1. A half height position from the lowest point F to the highest point E may correspond to the first surface S1, and the range between the dashed line L1 and the first surface S1 is the second region R2. Please refer to FIG. 5 and table 1. As shown in FIG. 5 and table 1, the zinc concentration within the first region R1 ranges from 22% to 27%, and the zinc concentration within the second region R2 ranges from 12% to 14%. The first zinc concentration may be 23%, which is an average any three points within the range P1 from the second surface S2 to a site located away from the second surface S2 by a tenth of the thickness TK. The second zinc concentration may be 13%, which is an average any three points within the range P2 from a site located away from the second surface S2 by nine tenths of the thickness TK to the first surface S1. Accordingly, the first zinc concentration is higher than the second zinc concentration according to the result described above. In this embodiment, the upward variation of the zinc concentration within the range P1 and adjacent to the second surface S2 may be nearly a straight line because of being close to the interface between layers. Under this condition, the any three points are taken after the highest point B, instead of being taken within a range between the second surface S2 and the highest point B (for example, the any three points may be taken within a range between a dashed line L2 and a dashed line L3 shown in FIG. 5, and that is, possible outliers or contaminated error values near the boundary interface may be excluded). The approach of taking points within the range P2 and the comparison between concentrations of other elements in the specification may also use the approach described above for taking points and making calculations after excluding the possible outliers or contaminated error values near the boundary interface.

TABLE 1

| At % | First region R1 | First concentration within the first range P1 | Second region R2 | Second concentration within the second range P2 |
| --- | --- | --- | --- | --- |
| Zn | 22-27% | 23% | 12-14% | 13% |

The following description will detail the different embodiments of the present disclosure. To simplify the description, identical components in each of the following embodiments are marked with identical symbols. For making it easier to understand the differences between the embodiments, the following description will detail the dissimilarities among different embodiments and the identical features will not be redundantly described.

Figure 6:
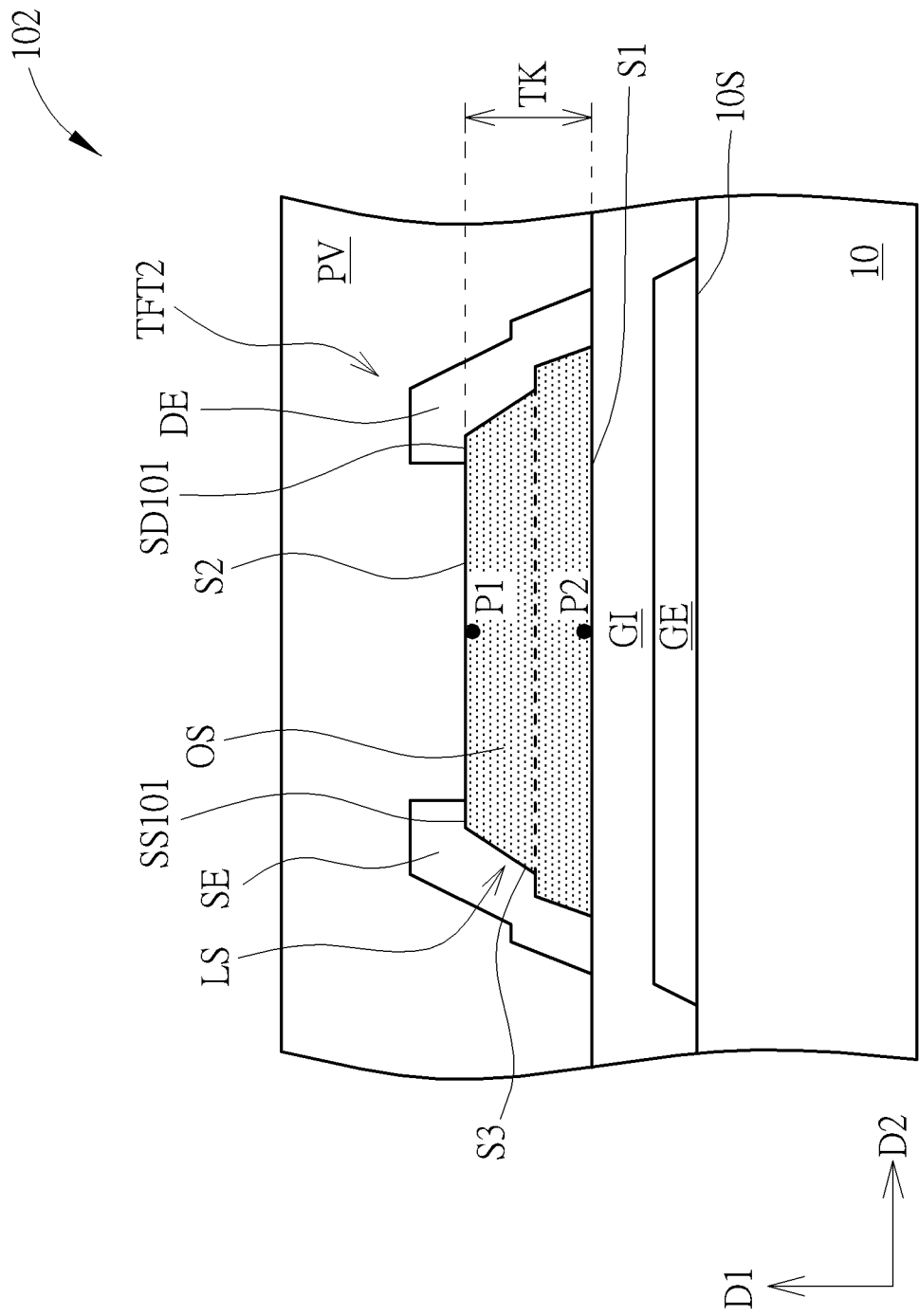
FIG. 6 is a schematic diagram of a work module according to a second embodiment of the present disclosure.

Please refer to FIG. 6. FIG. 6 is a schematic diagram of a work module 102 according to a second embodiment of the present disclosure. As shown in FIG. 6, in a transistor unit TFT2 of the work module 102, the lateral surface S3 of the active layer OS may be a non-flat structure LS (such as a stepped structure). Similar to the description in the first embodiment described above, in some embodiments, the portion of the active layer OS located above a dashed line and the portion of the active layer OS located under the dashed line shown in FIG. 6 may be formed by different targets in a PVD process respectively. Because of the differences in material composition ratio, an etching rate of the portion of the active layer OS located above the dashed line in a patterning process may be different from an etching rate of the portion of the active layer OS located under the dashed line in the patterning process, and the non-flat structure LS may be formed accordingly. It is worth noting that the non-flat structure LS is not limited to the bilayer structure of the active layer OS described above, and an active layer having a structure of more than two layers in other embodiments below may also have similar non-flat structures at the lateral surfaces.

Figure 7:
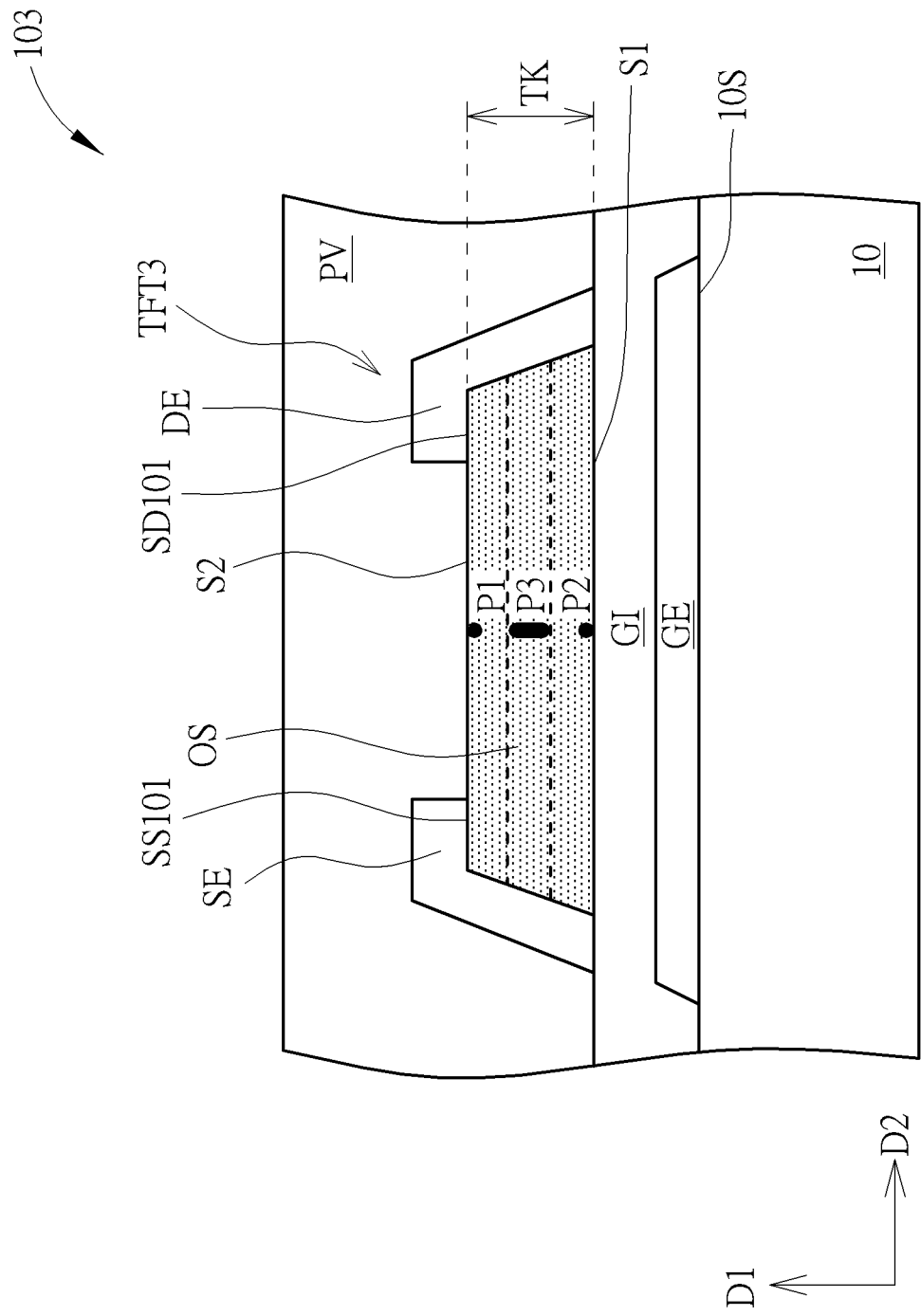
FIG. 7 is a schematic diagram of a work module according to a third embodiment of the present disclosure.

Please refer to FIG. 7. FIG. 7 is a schematic diagram of a work module 103 according to a third embodiment of the present disclosure. As shown in FIG. 7, in a transistor unit TFT3 of the work module 103, a first zinc concentration exists within a range P1 from the second surface S2 to a site located away from the second surface S2 by a tenth of the thickness TK in the active layer OS (in the direction extending towards the first surface S1), a second zinc concentration exists within a range P2 from a site located away from the second surface S2 by nine tenths of the thickness TK in the active layer OS to the first surface S1 (in the direction extending towards the first surface S1), a third zinc concentration exists within a range P3 from a site located away from the second surface S2 by three tenths of the thickness TK in the active layer OS to a site located away from the second surface S2 by seven tenths of the thickness TK in the active layer OS (in the direction extending towards the first surface S1), and the first zinc concentration is higher than the second zinc concentration and the third zinc concentration.

Additionally, in some embodiments, the active layer OS may further include gallium and indium. A first gallium concentration and a first indium concentration may exist within a range P1 from the second surface S2 to a site located away from the second surface S2 by a tenth of the thickness TK in the active layer OS (in the direction extending towards the first surface S1); a second gallium concentration and a second indium concentration may exist within a range P2 from a site located away from the second surface S2 by nine tenths of the thickness TK in the active layer OS to the first surface S1 (in the direction extending towards the first surface S1); and a third gallium concentration and a third indium concentration may exist within a range P3 from a site located away from the second surface S2 by three tenths of the thickness TK in the active layer OS to a site located away from the second surface S2 by seven tenths of the thickness TK in the active layer OS (in the direction extending towards the first surface S1).

In an exemplary example, the third zinc concentration described above may be higher than the second zinc concentration. The first gallium concentration may be higher than the third gallium concentration, and the third gallium concentration may be higher than the second gallium concentration. The second indium concentration may be higher than the third indium concentration, and the third indium concentration may be higher than the first indium concentration. Additionally, in some embodiments, the first zinc concentration may be higher than the first gallium concentration, and the first zinc concentration may be higher than the second indium concentration. In other words, the relatively higher zinc concentration and relatively higher gallium concentration may exist within the range P1 relatively adjacent to the back channel, the relatively higher indium concentration may exist within the range P2 relatively adjacent to the front channel, and the zinc concentration within the range P1 may be higher than the gallium concentration within the range P1 and the indium concentration within the range P2 for improving the performance of the active layer OS (such as enhancing the electron mobility), but not limited thereto.

It is worth noting that the active layer OS shown in FIG. 7 may be substantially a trilayer structure defined by dashed lines, for example, and the active layer OS may be divided into three regions formed by targets with different composition ratios in the PVD process, but not limited thereto. By the design of the composition ratios in the active layer OS described above, the band gap of the region in the active layer OS relatively adjacent to the back channel and the band gap of the region in the active layer OS relatively adjacent to the front channel may be relatively higher, the electrons in the active layer OS may be limited at the middle portion of the active layer OS and most of the electrons may not be transmitted at the interfaces for improving the influence of Coulomb's scattering at the back channel, scattering by rough surface, and/or Coulomb's scattering at the front channel, and the electron mobility of the transistor unit TFT3 may be enhanced accordingly, but not limited thereto.

In another exemplary example, the first zinc concentration is higher than the second zinc concentration and the third zinc concentration, and the third zinc concentration described above may be reduced for not being higher the second zinc concentration obviously. In addition, the first gallium concentration is higher than the second gallium concentration and the third gallium concentration, and the third gallium concentration described above may be reduced for not being higher the second gallium concentration obviously. Furthermore, the second indium concentration is higher than the first indium concentration and the third indium concentration, and the first indium concentration described above may be reduced for not being higher the third indium concentration obviously. It is worth noting that the first zinc concentration may be higher than the first gallium concentration, and the first zinc concentration may be higher than the second indium concentration. By the design of the composition ratios in the active layer OS described above, the reliability of the transistor unit TFT3 may be improved (for example, the photo-leakage current may be reduced and/or the stability under bias voltage may be improved).

In another exemplary example, the third indium concentration described above may be reduced for not being lower than the second indium concentration obviously, and the third indium concentration and the second indium concentration are higher than the first indium concentration. Similarly, the first zinc concentration may be higher than the first gallium concentration, and the first zinc concentration may be higher than the third indium concentration. The performance of the active layer OS may be improved (for example, the electron mobility may be enhanced) accordingly. Additionally, in some embodiments, the third indium concentration described above may be higher than the second indium concentration, but not limited thereto.

In another exemplary example, the second zinc concentration described above may be higher than the third zinc concentration. The first gallium concentration may be higher than the second gallium concentration and the third gallium concentration, and the second gallium concentration may be higher than the third gallium concentration. The third indium concentration may be higher than the first indium concentration and the second indium concentration, and the first zinc concentration may be higher than the second gallium concentration and the third indium concentration. Additionally, in some embodiments, the first zinc concentration may be higher than the first gallium concentration, and the first zinc concentration may be higher than the third indium concentration. The performance of the active layer OS may be improved (for example, the electron mobility may be enhanced) accordingly, but not limited thereto.

Figure 8:
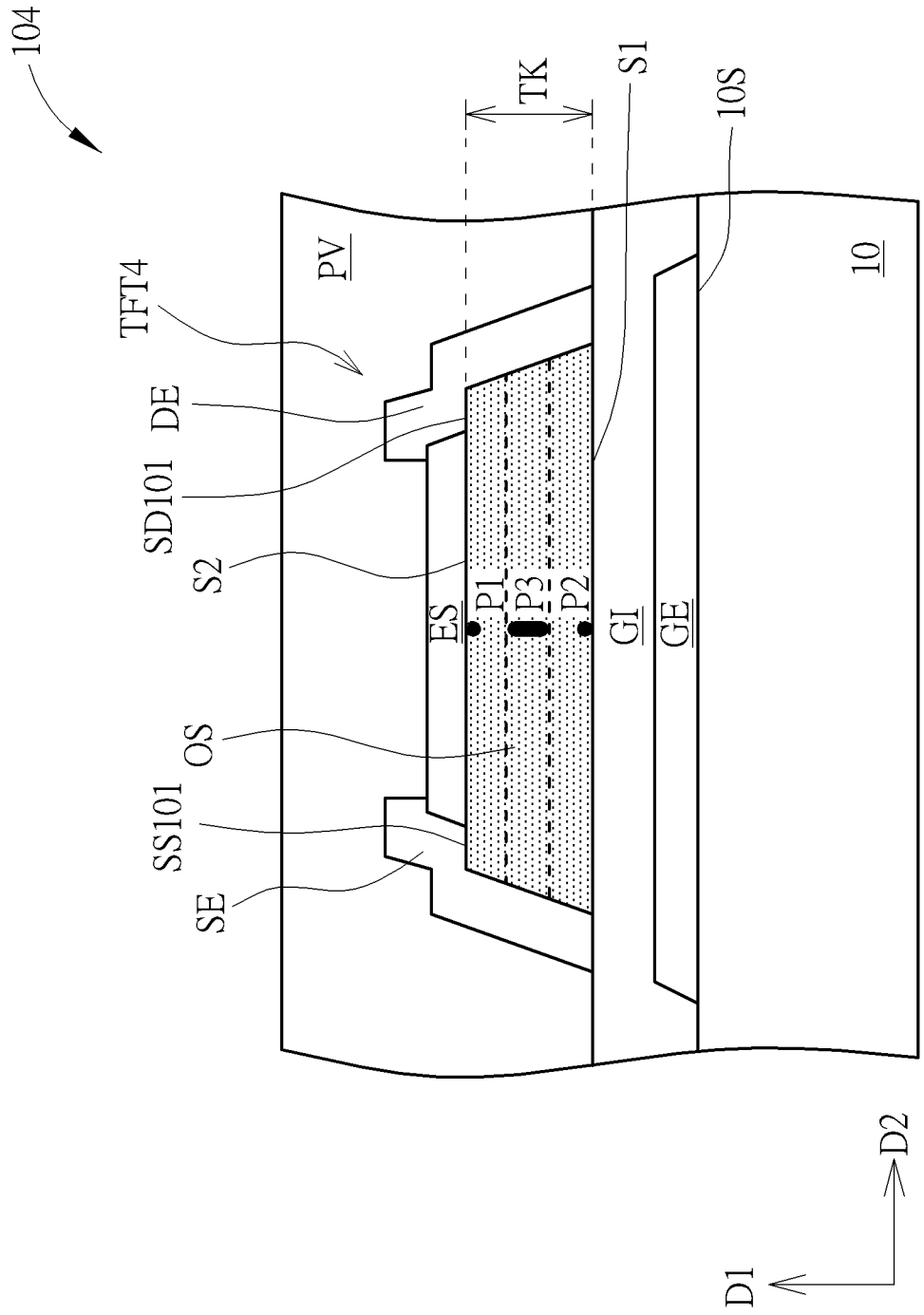
FIG. 8 is a schematic diagram of a work module according to a fourth embodiment of the present disclosure.

Please refer to FIG. 8. FIG. 8 is a schematic diagram of a work module 104 according to a fourth embodiment of the present disclosure. As shown in FIG. 8, a transistor unit TFT4 of the work module 104 may further include an etching stop layer ES disposed on the second surface S2 of the active layer OS, and the source electrode SE and the drain electrode DE may be partially disposed on the etching stop layer ES. The etching stop layer ES may include an oxide insulation material or other suitable insulation materials for protecting the second surface S2 of the active layer OS during the process of forming the source electrode SE and the drain electrode DE.

Figure 9:
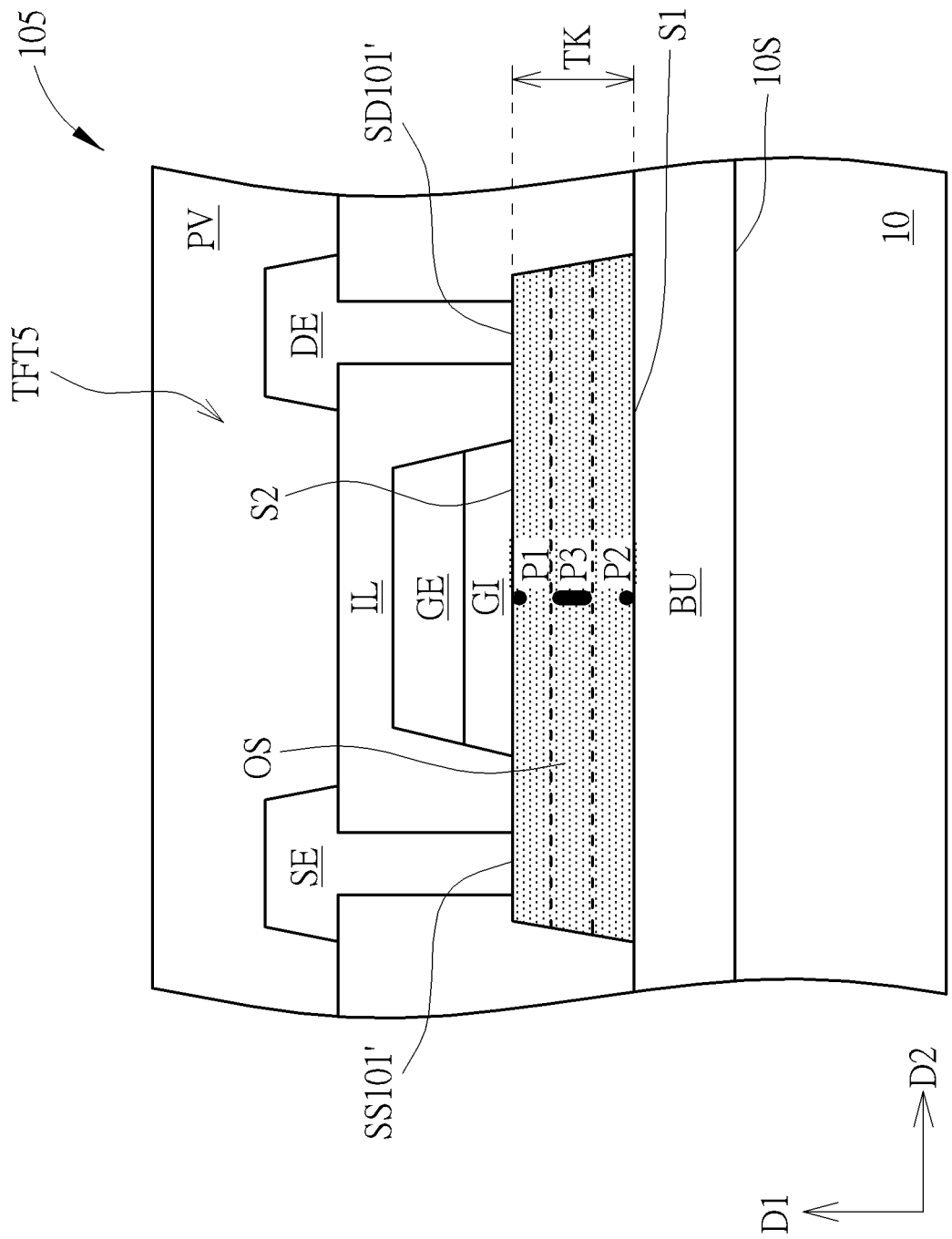
FIG. 9 is a schematic diagram of a work module according to a fifth embodiment of the present disclosure.

Please refer to FIG. 9. FIG. 9 is a schematic diagram of a work module 105 according to a fifth embodiment of the present disclosure. As shown in FIG. 9, in a transistor unit TFT5 of the work module 105, the active layer OS may be at least partially disposed between the gate electrode GE and the first substrate 10. In addition, the transistor unit TFT5 may further include a dielectric layer IL covering the active layer OS. The source electrode SE and the drain electrode DE may be partially disposed on the dielectric layer IL respectively, and the source electrode SE and the drain electrode DE may partially penetrate the dielectric layer for being electrically connected with corresponding regions in the active layer OS. Additionally, in some embodiments, at least one buffer layer BU may be disposed between the first substrate 10 and the active layer OS for improving the protection performance for the active layer OS beneath and/or improving related issues in the manufacturing process of the active layer OS, and more than one buffer layer BU may be disposed according to the design requirements, but not limited thereto. The dielectric layer IL and the buffer layer BU described above may include oxide, nitride, oxynitride, or other suitable dielectric materials. In this embodiment, the active layer OS has a first surface S1 and a second surface S2, the first surface S1 and the second surface S2 may be different from the embodiments described previously. In this embodiment, at least a part of the second surface S2 may be defined as an interface between the active layer OS and the source electrode SE, an interface between the active layer OS and the drain electrode DE, or an interface between the active layer OS and the gate dielectric layer G1, and at least a part of the first surface S1 may be defined as an interface between the active layer OS and the buffer layer BU. In some embodiments, the source electrode SE contacts the active layer OS and has a source electrode contact surface SS101', and the drain electrode DE contacts the active layer OS and has a drain electrode contact surface SD101'. The source electrode contact surface SS101' and the drain electrode contact surface SD101' may be flat surfaces or non-flat surfaces. In some embodiments, the second surface S2 of the active layer OS is located close to the gate electrode GE, and the first surface S1 of the active layer OS is located away from the gate electrode GE. In some embodiments, the first surface S1 of the active layer OS extends in the second direction D2 substantially in a cross-sectional diagram, the second surface S2 of the active layer OS extends in the second direction D2 substantially in the cross-sectional diagram, and the first surface S1 may be substantially parallel with the second surface S2. In some embodiments, the first surface S1 and the second surface S2 may be flat surfaces or non-flat surfaces, and the first surface S1 may be regarded as being parallel with the second surface S2 as long as the first surface S1 and the second surface S2 extend substantially in the second direction D2.

Figure 10:
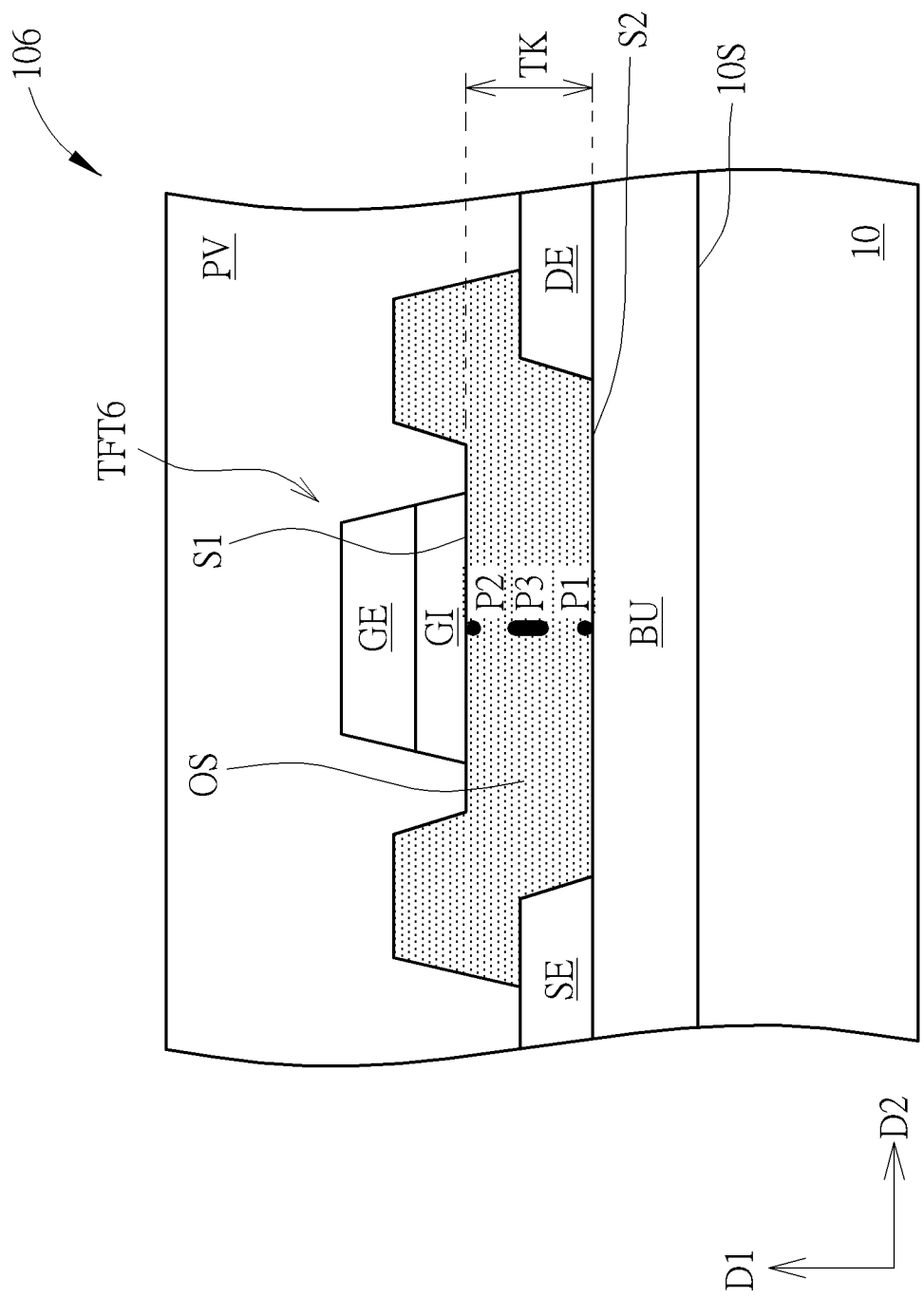
FIG. 10 is a schematic diagram of a work module according to a sixth embodiment of the present disclosure.

Please refer to FIG. 10. FIG. 10 is a schematic diagram of a work module 106 according to a sixth embodiment of the present disclosure. As shown in FIG. 10, in a transistor unit TFT6 of the work module 106, the active layer OS may be at least partially disposed between the gate electrode GE and the first substrate 10. In addition, the source electrode SE and the drain electrode DE may be at least partially disposed between the active layer OS and the buffer layer BU respectively, and the transistor unit TFT6 may be regarded as a top-gate coplanar transistor structure. In this embodiment, the active layer OS has a first surface S1 and a second surface S2, the first surface S1 and the second surface S2 may be different from the embodiments described previously. In this embodiment, at least a part of the second surface S2 may be defined as an interface between the active layer OS and the source electrode SE, an interface between the active layer OS and the drain electrode DE, or an interface between the active layer OS and the buffer layer BU, and at least a part of the first surface S1 may be defined as an interface between the active layer OS and the gate dielectric layer G1. It is worth noting that, the second surface S2 of the active layer OS is located close to the source electrode SE and the drain electrode DE, and the first surface S1 of the active layer OS is located away from the source electrode SE and the drain electrode DE. In some embodiments, the second surface S2 of the active layer OS extends in the second direction D2 substantially in a cross-sectional diagram, the first surface S1 of the active layer OS extends in the second direction D2 substantially in the cross-sectional diagram, and the first surface S1 is substantially parallel with the second surface S2. In some embodiments, the first surface S1 and the second surface S2 may be flat surfaces or non-flat surfaces, and the first surface S1 may be regarded as being parallel with the second surface S2 as long as the first surface S1 and the second surface S2 extend substantially in the second direction D2. In some embodiments, the second surface S2 of the active layer OS is located away from the gate electrode GE, and the first surface S1 of the active layer OS is located close to the gate electrode GE.

It is worth noting that the active layer OS in this disclosure is not limited to the transistor structures described above and may be applied in other kinds of transistor structures as needed. The transistor structures in the embodiments described above may also be applied in display switching units, driving circuits, or other suitable circuit units in each kind of work module as needed.

To summarize the above description, in the work module according to the present disclosure, different zinc concentrations may exist at different thickness locations in the active layer of the transistor unit for controlling the electron transmitting location in the active layer and improving the performance of the active layer and the transistor unit. In addition, the electron mobility and/or the reliability of the active layer may be modified by controlling the concentrations of the elements of the active layer at different thickness locations for satisfying operation requirements of transistor units for different functions. Without departing from the spirit of this disclosure, the technical features in the different embodiments described in the context may be replaced, recombined, and mixed with one another to form other embodiments for improving the performance of the active layer and the transistor unit.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:
1. A substrate module, comprising:
a first substrate; and
a transistor unit disposed on the first substrate, wherein the transistor unit comprises:
an active layer, wherein the active layer has a first surface and a second surface, and the first surface is opposite to the second surface; and a first electrode and a second electrode, wherein the first electrode and the second electrode at least partially overlap the active layer,
wherein the second surface contacts the first electrode and the second electrode,
wherein the active layer has a first range and a second range, and the first range is closer to the second surface than the second range,
wherein a first gallium concentration and a first zinc concentration exist within the first range in the active layer, and the first zinc concentration is higher than the first gallium concentration,
wherein a second zinc concentration exists within the second range in the active layer, and the first zinc concentration is higher than the second zinc concentration, and
wherein the active layer has a thickness, and the first range in the active layer is from the second surface to a site located away from the second surface by a tenth of the thickness in the active layer.

2. The substrate module according to claim 1, wherein a first indium concentration exists within the first range in the active layer, and the first gallium concentration is higher than the first indium concentration.

3. The substrate module according to claim 1, wherein a first indium concentration exists within the first range in the active layer, and the first zinc concentration is higher than the first indium concentration.

4. The substrate module according to claim 1, wherein a first indium concentration exists within the first range in the active layer, a second indium concentration exists within the second range in the active layer, and the second indium concentration is higher than the first indium concentration.

5. The substrate module according to claim 1, further comprising:
a second substrate; and
a medium, wherein the medium is disposed between the first substrate and the second substrate.

6. The substrate module according to claim 5, wherein the medium is a liquid crystal medium.

7. The substrate module according to claim 1, wherein the second range in the active layer is from a site located away from the second surface by nine tenths of the thickness in the active layer to the first surface.

8. A substrate module, comprising:
a first substrate; and
a transistor unit disposed on the first substrate, wherein the transistor unit comprises:
an active layer, wherein the active layer has a first surface and a second surface, and the first surface is opposite to the second surface; and
a first electrode and a second electrode, wherein the first electrode and the second electrode at least partially overlap the active layer,
wherein the second surface contacts the first electrode and the second electrode,
wherein the active layer has a first range and a second range, and the first range is closer to the second surface than the second range,
wherein a first zinc concentration and a first indium concentration exist within the first range in the active layer, and the first zinc concentration is higher than the first indium concentration,
wherein a second zinc concentration exists within the second range in the active layer, and the first zinc concentration is higher than the second zinc concentration, and
wherein the active layer has a thickness, and the first range in the active layer is from the second surface to a site located away from the second surface by a tenth of the thickness in the active layer.

9. The substrate module according to claim 8, wherein a first gallium concentration exists within the first range in the active layer, and the first gallium concentration is higher than the first indium concentration.

10. The substrate module according to claim 8, wherein a second indium concentration exists within the second range in the active layer, and the second indium concentration is higher than the first indium concentration.

11. The substrate module according to claim 8, further comprising:
a second substrate; and
a medium, wherein the medium is disposed between the first substrate and the second substrate.

12. The substrate module according to claim 11, wherein the medium is a liquid crystal medium.

13. The substrate module according to claim 10, wherein the second range in the active layer is from a site located away from the second surface by nine tenths of the thickness in the active layer to the first surface.

* * * * *